(12) United States Patent
Yoshitomi

(10) Patent No.: US 10,430,029 B2
(45) Date of Patent: Oct. 1, 2019

(54) CHARACTER INPUT ASSIST DEVICE

(71) Applicant: CALSONIC KANSEI CORPORATION, Saitama (JP)

(72) Inventor: Teruo Yoshitomi, Saitama (JP)

(73) Assignee: CALSONIC KANSEI CORPORATION, Saitama (JP)

( * ) Notice: Subject to any disclaimer, the term of this patent is extended or adjusted under 35 U.S.C. 154(b) by 225 days.

(21) Appl. No.: 15/532,925

(22) PCT Filed: Oct. 2, 2015

(86) PCT No.: PCT/JP2015/078068
§ 371 (c)(1),
(2) Date: Jun. 2, 2017

(87) PCT Pub. No.: WO2016/088442
PCT Pub. Date: Jun. 9, 2016

(65) Prior Publication Data
US 2017/0344200 A1    Nov. 30, 2017

(30) Foreign Application Priority Data

Dec. 3, 2014  (JP) .................................. 2014-245151
Sep. 18, 2015  (JP) .................................. 2015-184946

(51) Int. Cl.
*G06F 3/048*     (2013.01)
*G06F 3/0482*    (2013.01)
(Continued)

(52) U.S. Cl.
CPC ............ *G06F 3/0482* (2013.01); *G06F 3/018* (2013.01); *G06F 3/02* (2013.01); *G06F 3/023* (2013.01);
(Continued)

(58) Field of Classification Search
CPC ......... G06F 1/1624; G06F 3/016; G06F 3/018
See application file for complete search history.

(56) References Cited

U.S. PATENT DOCUMENTS 5,959,629 A     9/1999  Masui
2006/0005131 A1*  1/2006  Tao ....................... G06F 1/1624
                                                 715/702
(Continued)

FOREIGN PATENT DOCUMENTS

CN       1534543 A     10/2004
CN     101124622 A      2/2008
(Continued)

OTHER PUBLICATIONS

International Search Report (English Translation) from PCT/JP2015/078068 dated Nov. 2, 2015 (2 pages).
(Continued)

*Primary Examiner* — Claudia Dragoescu
(74) *Attorney, Agent, or Firm* — Calfee, Halter & Griswold LLP

(57) ABSTRACT

Principally, character input operation can be carried out surely in a simplified manner and in a short time. A character input assist device includes one or more side edge parts provided at a panel surface of a touch panel to have a step serving as a finger hold, and a character icon display controller that is configured to display, along the side edge parts at the panel surface, a plurality of first character icons and second character icons associated with a selected first character icon, and an icon identifiers provided at the side edge parts to allow the position of each of the first character icons or the second character icons to be individually identified.

12 Claims, 14 Drawing Sheets

(51) Int. Cl.
*G06F 3/0488* (2013.01)
*G06F 3/01* (2006.01)
*G06F 3/02* (2006.01)
*G06F 3/023* (2006.01)
*G06F 3/039* (2013.01)
*H03M 11/04* (2006.01)
*G06F 3/0481* (2013.01)

(52) U.S. Cl.
CPC ............ *G06F 3/039* (2013.01); *G06F 3/0488* (2013.01); *G06F 3/04817* (2013.01); *G06F 3/04886* (2013.01); *H03M 11/04* (2013.01); *G06F 2203/04803* (2013.01)

(56) References Cited

U.S. PATENT DOCUMENTS

| | | | | |
|---|---|---|---|---|
| 2006/0265649 A1* | 11/2006 | Danilo | .................. | G06F 17/211 715/256 |
| 2009/0085874 A1* | 4/2009 | Heo | ...................... | G06F 3/0482 345/169 |
| 2011/0122083 A1 | 5/2011 | Takahashi et al. | | |
| 2011/0219302 A1* | 9/2011 | Kondo | .................. | G06F 3/0416 715/702 |
| 2013/0300664 A1* | 11/2013 | Winer | .................. | G06F 17/276 345/168 |
| 2015/0130728 A1 | 5/2015 | Takenaka | | |

FOREIGN PATENT DOCUMENTS

| | | |
|---|---|---|
| EP | 0844570 A1 | 5/1998 |
| JP | 2002091676 A | 3/2002 |
| JP | 2003157144 A | 5/2003 |
| JP | 2005092441 A | 4/2005 |
| JP | 2006148536 A | 6/2006 |
| JP | 2008507011 A | 3/2008 |
| JP | 2013033395 A | 2/2013 |
| KR | 20070039116 A | 11/2007 |
| WO | 2006005993 A2 | 1/2006 |
| WO | 2010008078 A1 | 1/2010 |
| WO | 2014006806 A1 | 1/2014 |

OTHER PUBLICATIONS

First Office Action for Chinese Patent Application No. 201580065859.3 dated May 29, 2019.

* cited by examiner

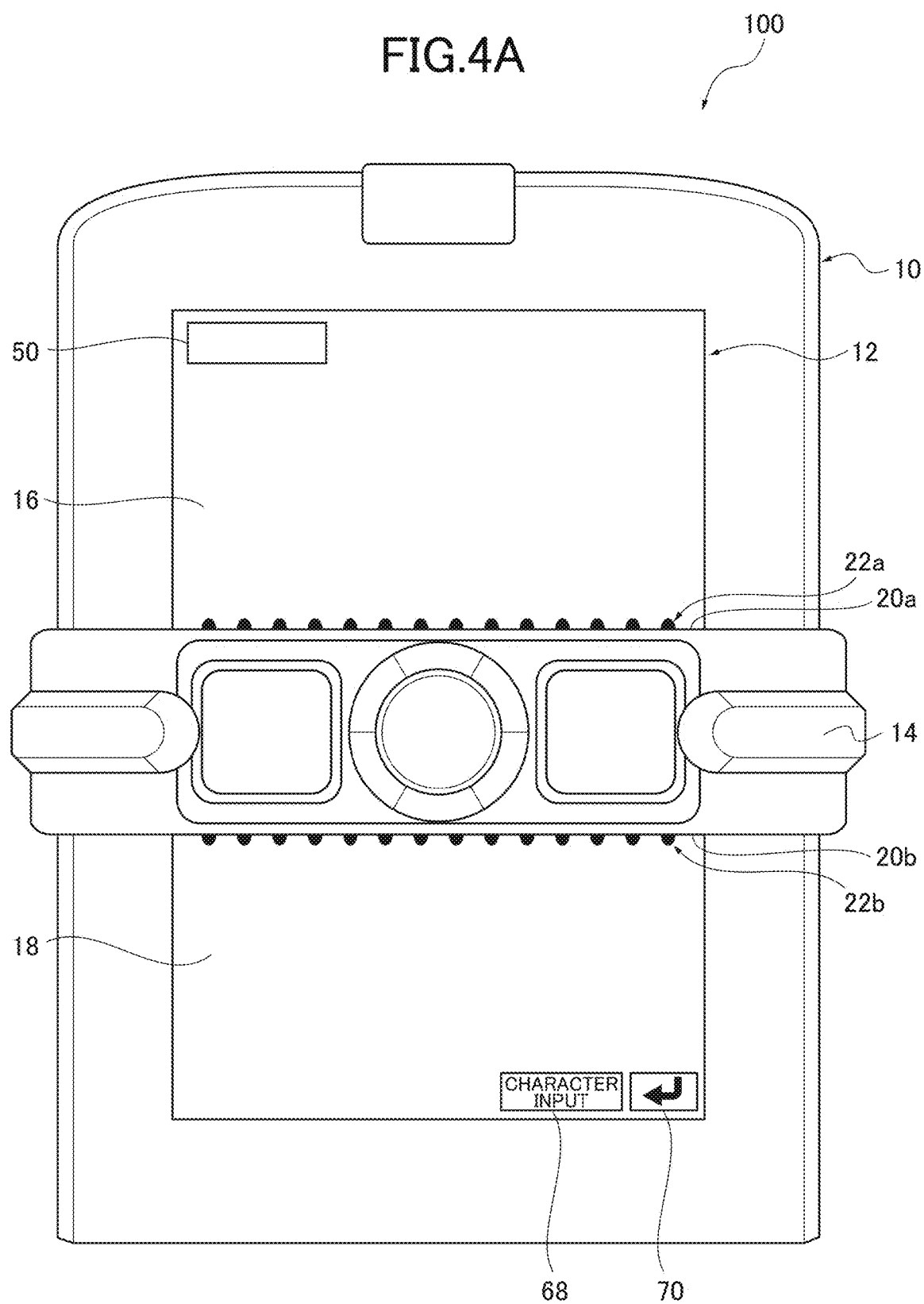

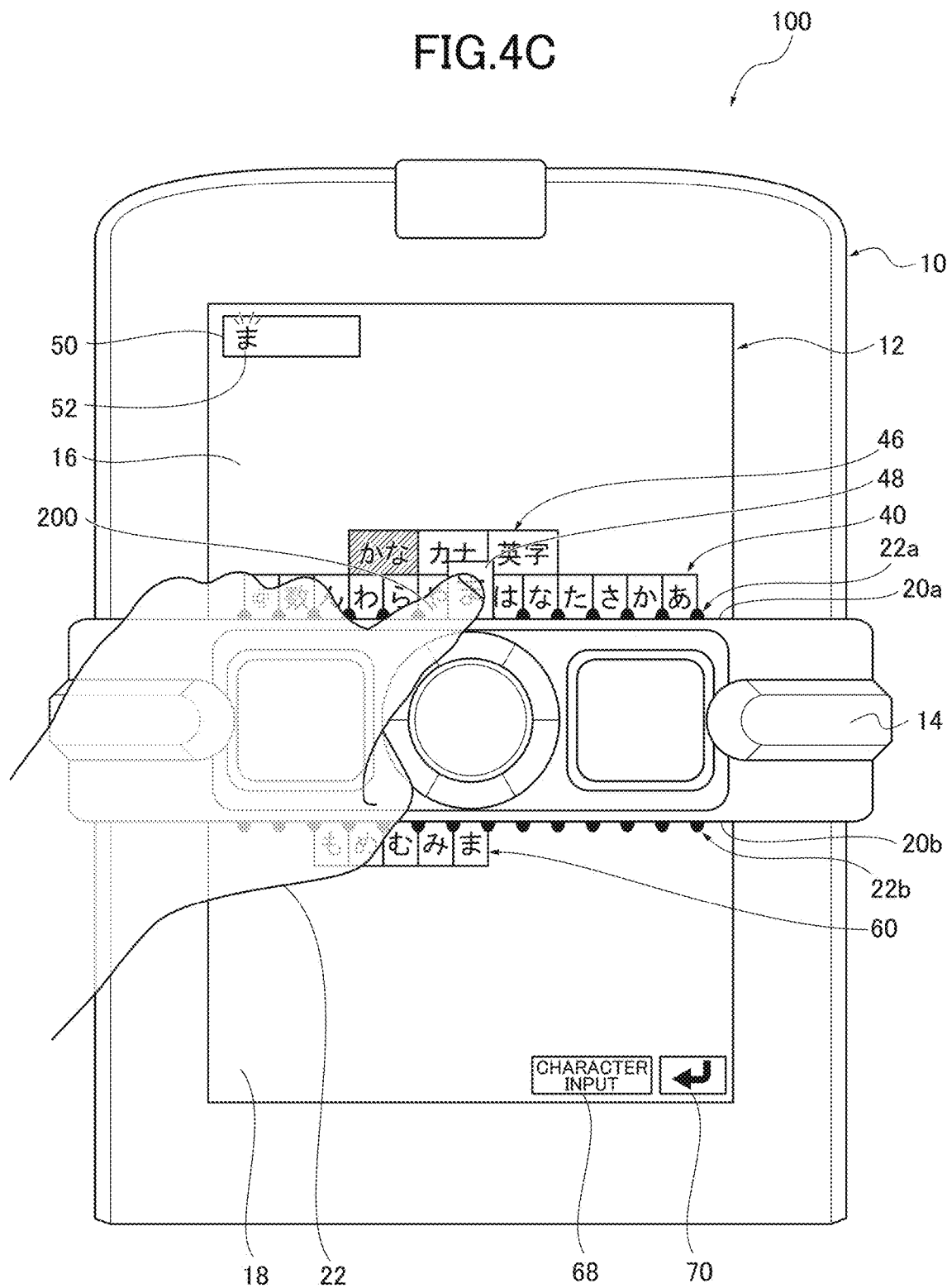

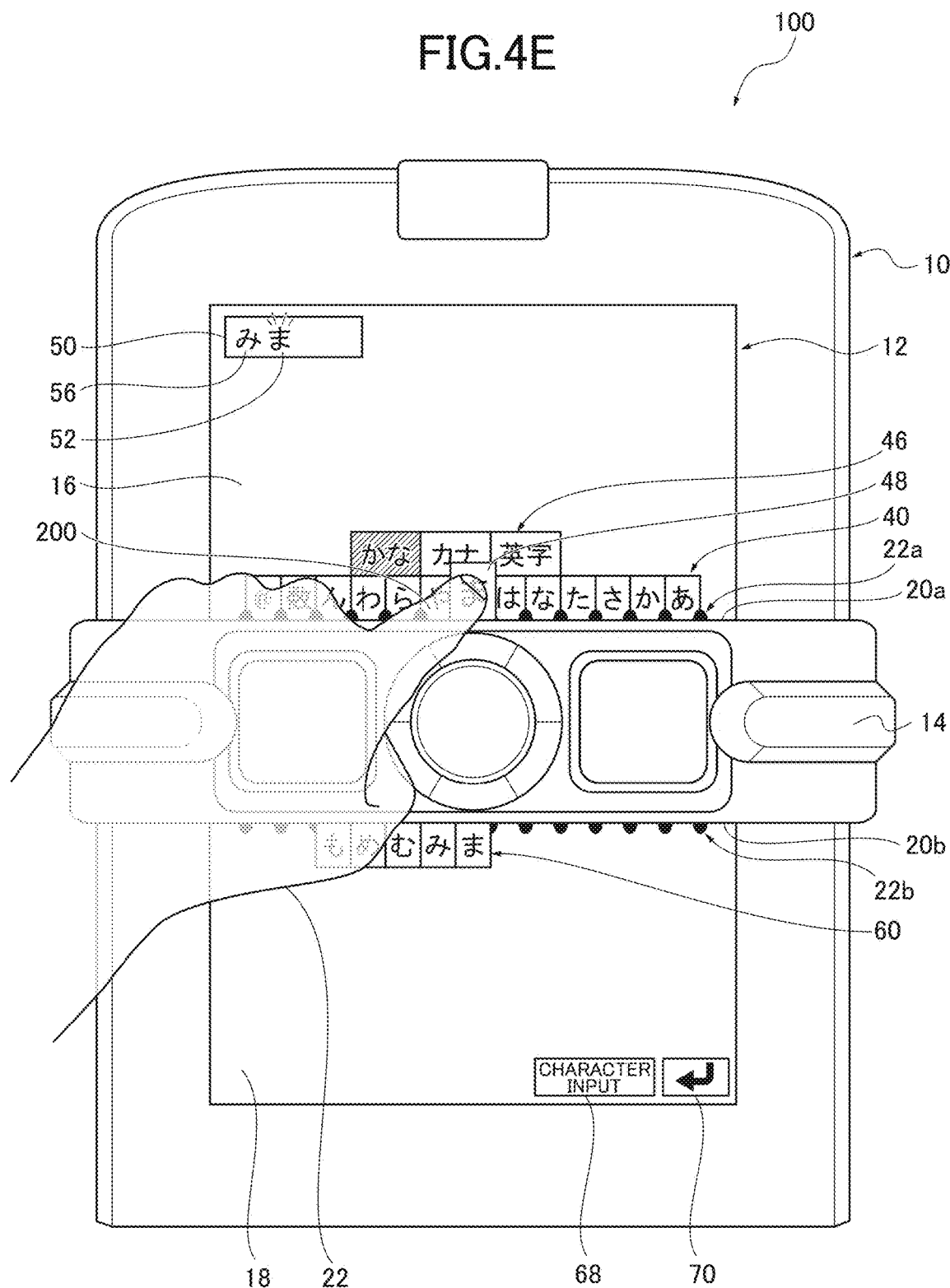

CHARACTER INPUT ASSIST DEVICE

CROSS-REFERENCE TO RELATED APPLICATIONS

This application is the 371 application of PCT Application No. PCT/JP2015/078068, filed Oct. 2, 2015, which is based upon and claims priority to Japanese Patent Application No. 2014-245151, filed Dec. 3, 2014, and Japanese Patent Application No. 2015-184946, filed Sep. 18, 2015, the entire contents of which are incorporated herein by reference.

TECHNICAL FIELD

The present invention relates to a character input assist device that assists in operation for inputting characters using a touch panel.

BACKGROUND ART

Recently, input devices equipped with a touch panel have been widely used as character input devices or input display devices for example in multi-function mobile terminals. Such a character input device is provided with for example a plurality of selection switches 112, 114, 116, and 118 in one switch 110 provided in the touch panel as shown in FIG. 9A (see for example Patent Literature 1) so that various kinds of character information can be input on a small touch panel screen. One of the selection switches 112, 114, 116, and 118 is selected when the switch 110 as a main switch is pressed by an operation tool such as a stylus pen and then the stylus pen is moved a distance in a desired input direction, so that a corresponding character (one of Japanese characters "い" to "お" in the example) can be input.

As shown in FIG. 9B, a character input device configured to pop up an indication of switches 124 related to an input key 122 provided at a mobile device 120 at the display part of the touch panel in response to pressing of the input key 122 has been suggested (for example Patent Literature 2). The operator of the mobile device 120 can select a character desired to be input from the popped up switches 124 by flick operation and carry out necessary character input.

CITATION LIST

Patent Literature

Patent Literature 1: JP 2003-157144A
Patent Literature 2: JP 2013-33395A

SUMMARY

Technical Problem

However, in the character input device disclosed in Patent Literature 1, much attention should be paid on the touch panel screen during operation so that the positions of the selection switches 112, 114, 116, and 118 are pressed without slipping in order to surely select characters desired to be input. Therefore, it may take long to input characters. When the stylus pen slips on the touch panel and presses a shifted position, input of the character may fail.

In the character input device disclosed in Patent Literature 2, the operator must select one desired character from the popped up switches 124 and therefore must flick correctly. On the other hand, the popped up switches 124 are displayed without any guide on the display screen of the touch panel, and therefore, much attention should be paid on the display screen in order to correctly select a desired switch among the switches 124 by flick operation. In the case, when the flicking is made in a shifted direction, input of a necessary character may fail.

The present invention has been made in view of the problems and an object of the invention is to allow input of necessary characters to be surely carried out in a simplified manner and in a short time.

Solution to Problem

In order to solve the problems, a character input assist device according to the present invention includes: at least one side edge part provided to have a step serving as a finger hold with respect to a panel surface of a touch panel; a character icon display controller configured to display a plurality of first character icons along the side edge part on the panel surface and one or a plurality of second character icons associated with a selected first character icon selected from the plurality of first character icons on the panel surface; a character input controller configured to carry out input of a character corresponding to the selected first character icon selected from the first character icons or input of a character corresponding to a selected second character icon selected from the second character icons; and an icon identifier that is provided at the side edge part to allow location of each of the first character icons or the second character icons to be individually identified.

Advantageous Effects

As a result of the above-described configuration, the character input assist device according to the present invention allows necessary characters to be surely selected by sliding the finger along the side edge part. Therefore, characters desired to be input can be selected surely in a short time.

BRIEF DESCRIPTION OF DRAWINGS

FIG. 4A is a view of an example of an input screen of the character input assist device in a node N1 state in FIG. 3.

FIG. 4C is a view of an example of an input screen of the character input assist device in a node N3 state in FIG. 3.

FIG. 4E is a view of an example of an input screen of the character input assist device in a node N5 state in FIG. 3.

DESCRIPTION OF EMBODIMENTS

A character input assist device according to a specific embodiment of the present invention will be described in conjunction with the accompanying drawings.

First Embodiment

Figure 1:
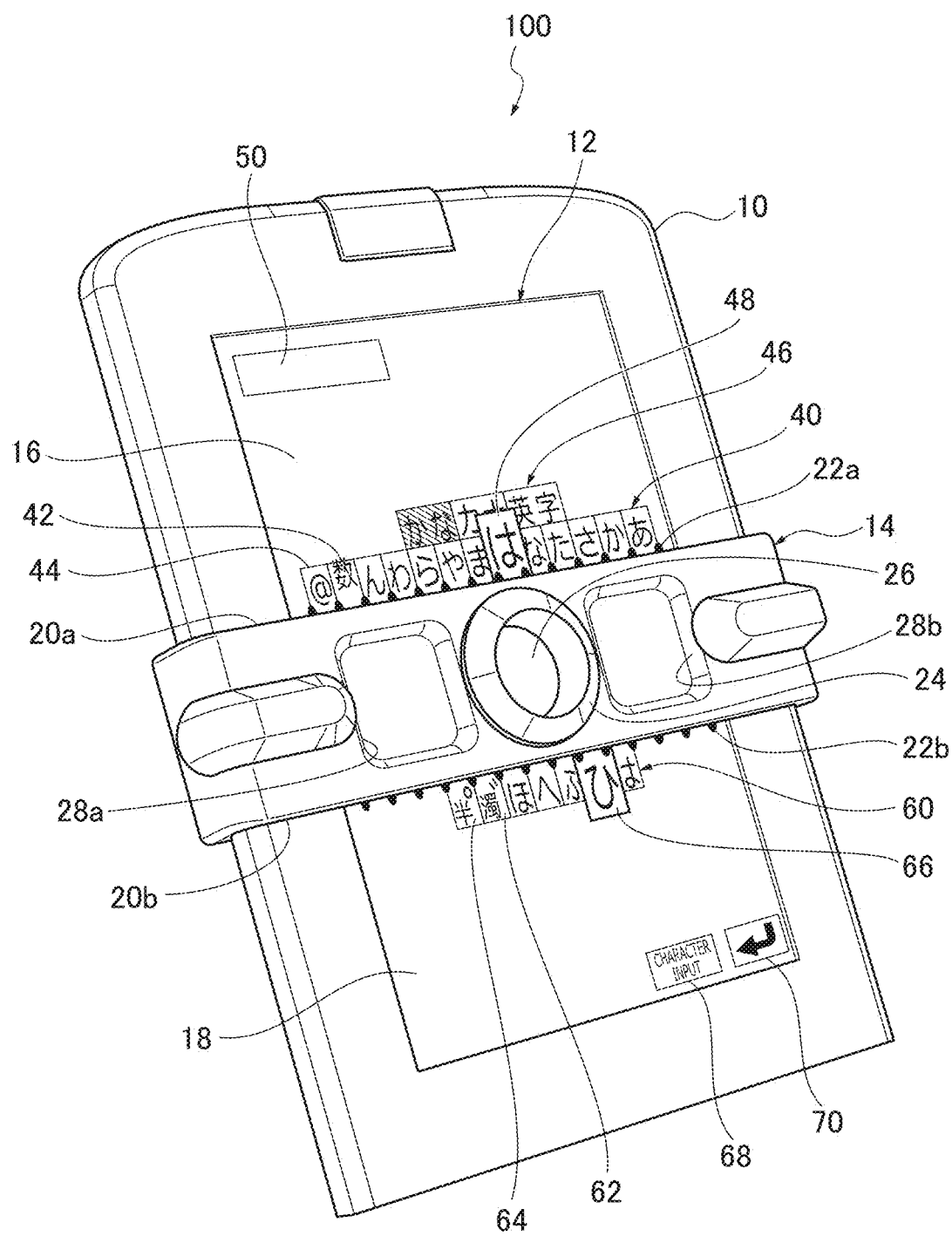
FIG. 1 is a perspective view of an outer appearance of a character input assist device according to First Embodiment of an embodiment.
Figure 2:
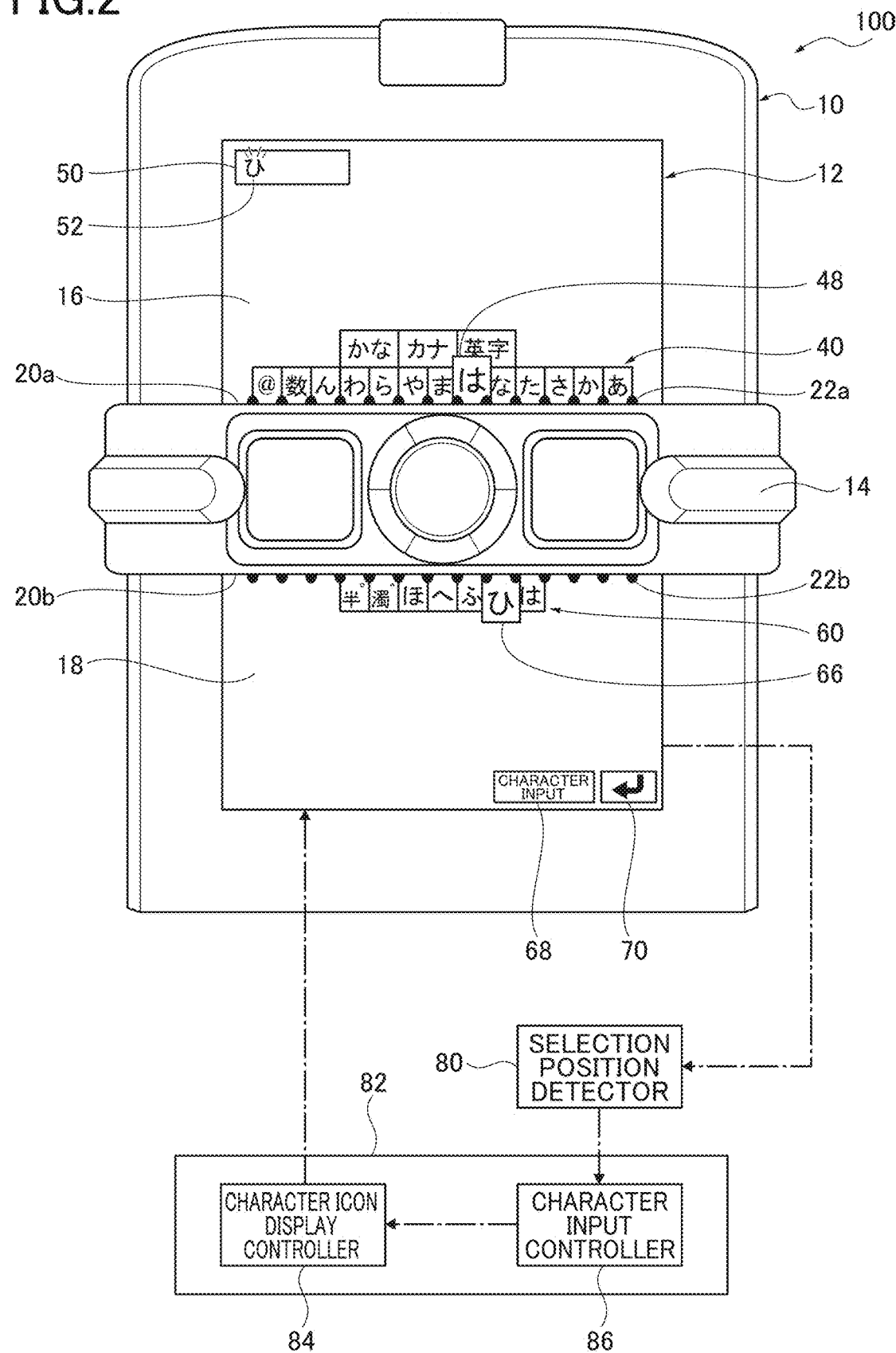
FIG. 2 is a functional block diagram of a functional configuration of the character input assist device according to First Embodiment.

FIG. 1 is a view of an outer appearance of a character input assist device 100 according to an embodiment of the present invention. FIG. 2 is a functional block diagram of a functional configuration of the character input assist device 100. The outer appearance of the character input assist device 100 according to this embodiment will be described with reference to FIG. 1.

Description of Outer Appearance of Character Input Assist Device

As shown in FIG. 1, a character input device (or input display device) such as a multi-function mobile terminal has a frame shaped main body 10 and a touch panel surface 12 mounted in the main body 10. The panel surface 12 is provided with a partition member 14 provided to cross the panel surface 12 in the widthwise direction. Note that the touch panel used according to this embodiment may be of any type. In other words, the touch panel may be any of resistive, capacitive, optical touch panels, and the like.

The panel surface 12 of the touch panel also serves as a liquid crystal display and is divided into two regions by the partition member 14. The two regions are for example a first region 16 above the partition member 14 and a second region 18 under the partition member 14.

The character input assist device 100 includes one or more side edge parts 20a and 20b provided to have a step serving as a finger hold with respect to the panel surface 12 of the touch panel. The side edge parts 20a and 20b need only be distinguishable by tactile sensation to the finger. According to this embodiment, the upper and lower sides of the partition member 14 serve as the side edge parts 20a and 20b. A plurality of first character icons 40 are displayed along the upper side edge part 20a of the partition member 14 in the first region 16. One or more second character icons 60 are displayed along the lower side edge part 20b of the partition member 14 in the second region 18.

Icon identifiers 22a adapted to allow the positions of the first character icons 40 to be individually identified are provided at the upper side edge part 20a of the partition member 14. The icon identifiers 22a allow the first character icons 40 to be identified by tactile sensation to the finger and are formed as a plurality of upward raised parts along the panel surface 12 from the side edge part 20a. Icon identifiers 22b adapted to allow the positions of the second character icons 60 to be individually identified are provided at the lower side edge part 20b of the partition member 14. The icon identifiers 22b allow the second character icons 60 to be identified by tactile sensation to the finger and are formed as downward raised parts along the panel surface 12 from the side edge part 20b. Note that the icon identifiers 22a and 22b need only to have a sufficient amount of projection to let the finger perceive their raised shape by passing the finger on the side edge parts 20a and 20b of the partition member 14 and may be in any shape. The first character icons 40 are each displayed between two adjacent raised parts that form the icon identifiers 22a. The second character icons 60 are each displayed between two adjacent raised parts that form the icon identifiers 22b.

When for example Japanese "hiragana input" is carried out, the first character icons 40 are icons for "hiragana" information corresponding to the first row of a widely known table of the Japanese syllabary (or "Japanese hiragana table") that includes combinations of the vowels and the consonants, or the row starting with "あ" (the row including combinations of the consonants k, s, t, n . . . and the vowel "あ" (a), i.e., "あ" (a), "か" (ka), "さ" (sa), "た" (ta), "な" (na), . . . ). In addition, the first character icons 40 may have a numeric input icon 42 for selecting "numeric input," a symbol input icon 44 for selecting "symbol input," and a character-kind icon 46 for switching among "hiragana," "katakana," and "alphabet."

The second character icons 60 indicate "hiragana" information that belongs to the group of a selected character icon (that will be later described as a selected first character icon 48) selected from the first character icons 40 in a column in the Japanese syllabary table (i.e., the column of combinations of the vowels and a particular consonant). For example, as shown in FIG. 1, when "は" (ha) is selected from the first character icons 40, the five characters corresponding to the "は" column, "は" (ha), "ひ" (hi), "ふ" (hu), "へ" (he), and "ほ" (ho) are displayed as the second character icons 60. The second character icons 60 may also include a voiced consonant input icon 62 for selecting "voiced consonant (dakuon) input" (ば, び, ぶ, べ, and ぼ, or ba, bi, bu, be, and bo) and a p-sound consonant input icon 64 for selecting "p-sound consonant (handakuon) input" (ぱ, ぴ, ぷ, ぺ, and ぽ, or pa, pi, pu, pe, and po). Note that the voiced consonant input icon 62 and the p-sound consonant input icon 64 are displayed as required only when there is a voiced consonant or p-sound consonant for a "hiragana character" displayed as the second character icon 60. More specifically, in the example shown in FIG. 1, the selected "は" column has both a voiced consonant and a p-sound consonant, and therefore the voiced consonant input icon 62 and the p-sound consonant input icon 64 are both displayed. Note that the arrangement of the first character icons 40 and the second character icons 60 may be applied not only to Japanese but also to any language, the characters of which can be classified into a two-dimensional table of rows and columns similarly to the above.

The first character icons 40 are each displayed in an enlarged size when selected. The enlarged icon will be referred to as the selected first character icon 48. The selected first character icon 48 notifies the operator of the selection of the first character icon 40.

Similarly, the second character icons 60 are each displayed in an enlarged size when selected. The enlarged icon will be referred to as the selected second character icon 66. The selected second character icon 66 notifies the operator of the selection of the second character icon 60.

An input character window 50 for displaying a selected character and a determined character is provided in the upper part of the first region 16 as a displayed section on the screen. A character input switch 68 for indicating the start of character input and a character input completion switch 70 for indicating the completion of character input are provided in the lower part of the second region 18 as a displayed section on the screen.

Note that the partition member 14 has three openings 26, 28a, and 28b provided therethrough from the surface. The panel surface 12 of the touch panel is exposed at the backside ends of these openings 26, 28a, and 28b, and predetermined switches corresponding to the three openings 26, 28a, and 28b are displayed as required on the parts of the panel surface 12 of the touch panel.

Among these openings, the openings 28a and 28b have a rectangular shape, and the switches displayed at the panel surface 12 can be operated by pressing the part of the panel surface 12 that corresponds to the opening 26 or stroking the side edges of the openings 28a and 28b.

The other opening 26 has a circular shape and can be operated by pressing the switch displayed at the part of the panel surface 12 that corresponds to the opening 26. Note that a ring-shaped dial 24 is rotatably provided at the outer circumference of the opening 26. The dial 24 can be turned freely so that each of prescribed allocated selecting functions can be carried out.

Note that the partition member 14 can be moved in the longitudinal direction along the panel surface 12 of the touch panel. The operator can adjust the longitudinal position of the partition member 14 to a position so that the operator can carry out operation easily. The longitudinally adjusted position of the partition member 14 is measured by a partition member position detector which is not shown in FIG. 1, and the first character icons 40 are displayed in the first region 16 formed according to the longitudinal position of the partition member 14. Then, the second character icons 60 are displayed in the second region 18 formed according to the longitudinal position of the partition member 14.

Description of Functional Configuration of Character Input Assist Device

Now, the functional configuration of the character input assist device 100 according to this embodiment will be described with reference to FIG. 2. In the character input assist device 100, the position (coordinates) of the panel surface 12 pressed by the operator is detected by a selected position detector 80. In a character input controller 86 mounted in a touch panel control ECU 82, input control (that will be described) for character icons (first and second character icons 40 and 60) in response to the pressed positions of the panel surface 12 is carried out. Then, in a character icon display controller 84, display control (that will be described) in response to the pressed positions of the panel surface 12 is carried out.

The input control for the character icons (first and second character icons 40 and 60) includes two kinds of control, character icon selection control in which the displayed first or second character icon 40 or 60 is pressed for selection and character icon determination control in which the first or second character icon 40 or 60 is determined by releasing the pressing (releasing the finger).

Display control for character icons (first and second character icons 40 and 60) includes four kinds of control, character icon display control in which a character icon is displayed, character icon deletion control in which a character icon is deleted, character icon enlarged display control in which a selected character icon is enlarged and displayed as a selected first character icon 48 or a selected second character icon 66, and character icon enlarged display end control in which the selected first character icon 48 or the selected second character icon 66 is reduced back to its originally displayed size.

Description of Operation of Character Input Assist Device

Figure 3:
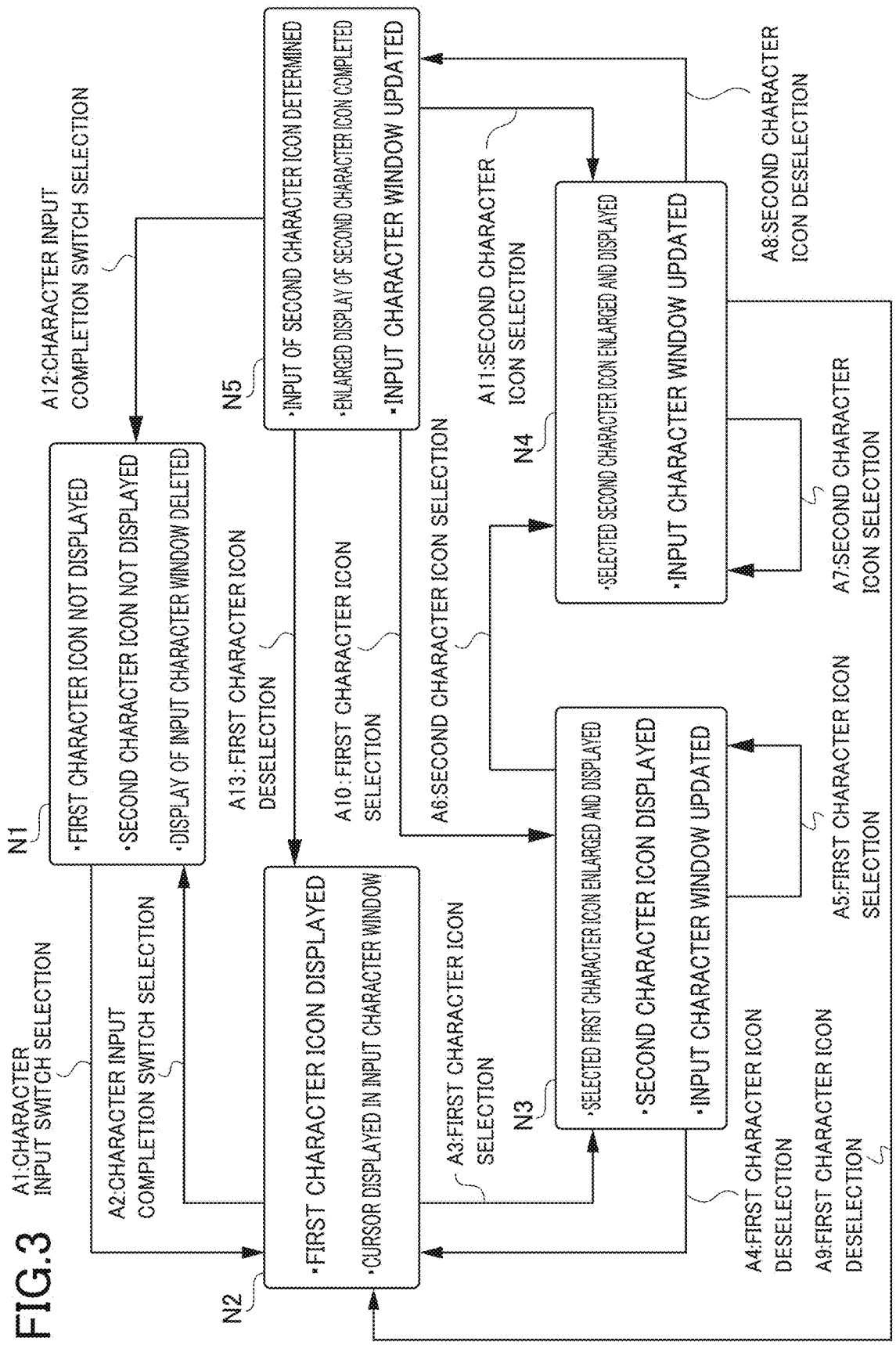
FIG. 3 is a state transition diagram of character input operation carried out in the character input assist device according to First Embodiment.

Now, with reference to FIGS. 3 and 4A to 4E, the flow of character input operation in the character input assist device 100 will be described step by step. FIG. 3 is a state transition diagram for character input carried out in the character input assist device 100.

Description of Node N1 State

A node N1 state in the state transition diagram in FIG. 3 will be described with reference to FIG. 4A. In the node N1 state, the panel surface of the character input assist device 100 is in a state as shown in FIG. 4A. In the state, the character icon deletion control is carried out by the character icon display controller 84 (FIG. 2), so that neither of the first character icon 40 and the second character icon 60 is displayed in the first and second regions 16 and 18. The input character window 50 is also deleted. When there is a transition from a node N2 or a node N5 shown in FIG. 3 to the node N1, a character input result determined at the time is displayed in the input character window 50.

Here, the transition to the node N1 is caused when a function that necessitates character input with an actual application screen (such as a car navigation screen and an audio screen) is selected though not shown in FIG. 3 as well as when an arc A2 shown in FIG. 3 (that will be described) or an arc A12 (that will be described) is selected.

Description of Node N2 State

Figure 4B:
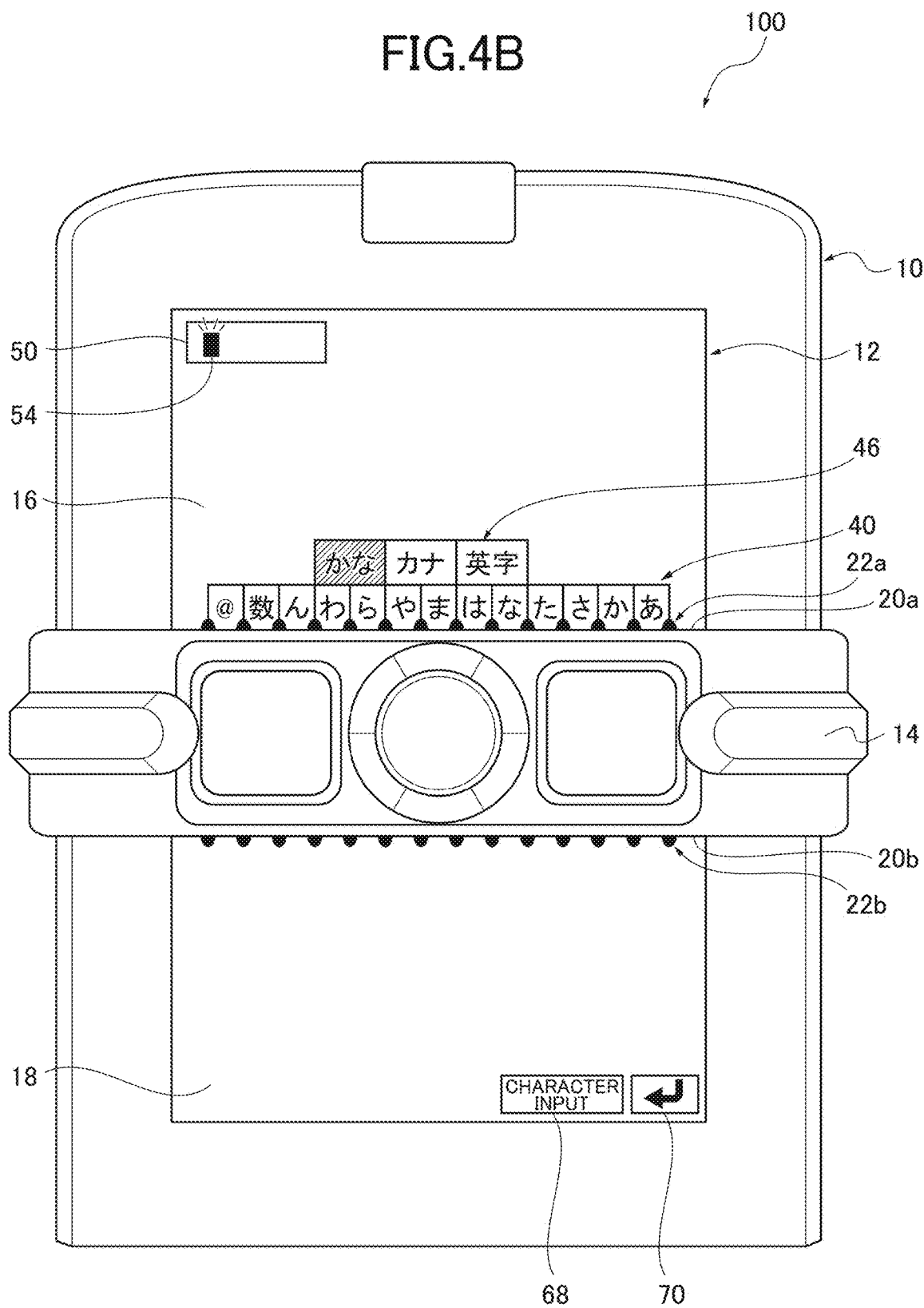
FIG. 4B is a view of an example of an input screen of the character input assist device in a node N2 state in FIG. 3.

Now, a node N2 state in the state transition diagram in FIG. 3 will be described with reference to FIG. 4B. In the node N2 state, the panel surface of the character input assist device 100 is in a state as shown in FIG. 4B. In this state, the character icon display controller 84 (FIG. 2) carries out the character icon display control to display the first character icon 40 and the character-kind icon 46 in the first region 16.

A cursor 54 flashes on and off in the input character window 50 to notify that character input can be carried out. Note that when there is a transition from the node N3 or node N5 shown in FIG. 3 to the node N2, a result of character input determined at the time is also displayed in the input character window 50.

Description of Node N3 State

Now, the node N3 state in the state transition diagram in FIG. 3 will be described with reference to FIG. 4C. In the node N3 state, the panel surface of the character input assist device 100 is in a state as shown in FIG. 4C. At the time, the operator of the character input assist device 100 touches the side edge part 20a of the partition member 14, slides the finger 200 (index finger for example) on the screen in the widthwise direction while pressing the first character icon 40 and moves the finger 200 to the position of the desired first character icon 40. At the time, the finger 200 is in contact with the raised parts of the icon identifiers 22a, and therefore the operator can recognize the position of the desired first character icon 40 without paying continuous attention to the panel surface 12 by recognizing how many times the operator has touched the raised part of the icon identifier 22a.

At the time, the character icon selection control is carried out by the character input controller 86 (FIG. 2), so that the pressed first character icon 40 is selected. Then, the character icon display controller 84 (FIG. 2) carries out the character icon enlarged display control, so that the pressed first character icon 40 is enlarged and displayed as the selected first character icon 48. Every time the selected first character icon 40 is changed, the character icon display controller 84 (FIG. 2) carries out the character icon enlarged display end control, so that the enlarged display of the selected first character icon 48 ends.

Then, the character icon display controller 84 (FIG. 2) carries out the character icon display control to the newly selected first character icon 40, so that the second character icon 60 corresponding to the selected first character icon 48 enlarged and displayed (selected) is displayed in the second region 18. At the time, the second character icon 60 is displayed in the vicinity of a position opposed to the selected first character icon 48 across the partition member 14 (for example in the range around the index finger (finger 200) in which the thumb (thumb or finger 202) can be moved without difficulty). Note that the second character icon 60 displayed at the time is a "hiragana" corresponding to a "hiragana" in a row to which the selected first character icon 48 belongs (the " ま " row in the example in FIG. 4C).

At the time, the display of a character corresponding to the selected first character icon 48 flashes on and off in the input character window 50 as a selected character 52. Note that when there is a transition from the node N2 or the node N5 shown in FIG. 3 to the node N3, a determined character input result at the time is also displayed in the input character window 50.

Description of Node N4 State

Figure 4D:
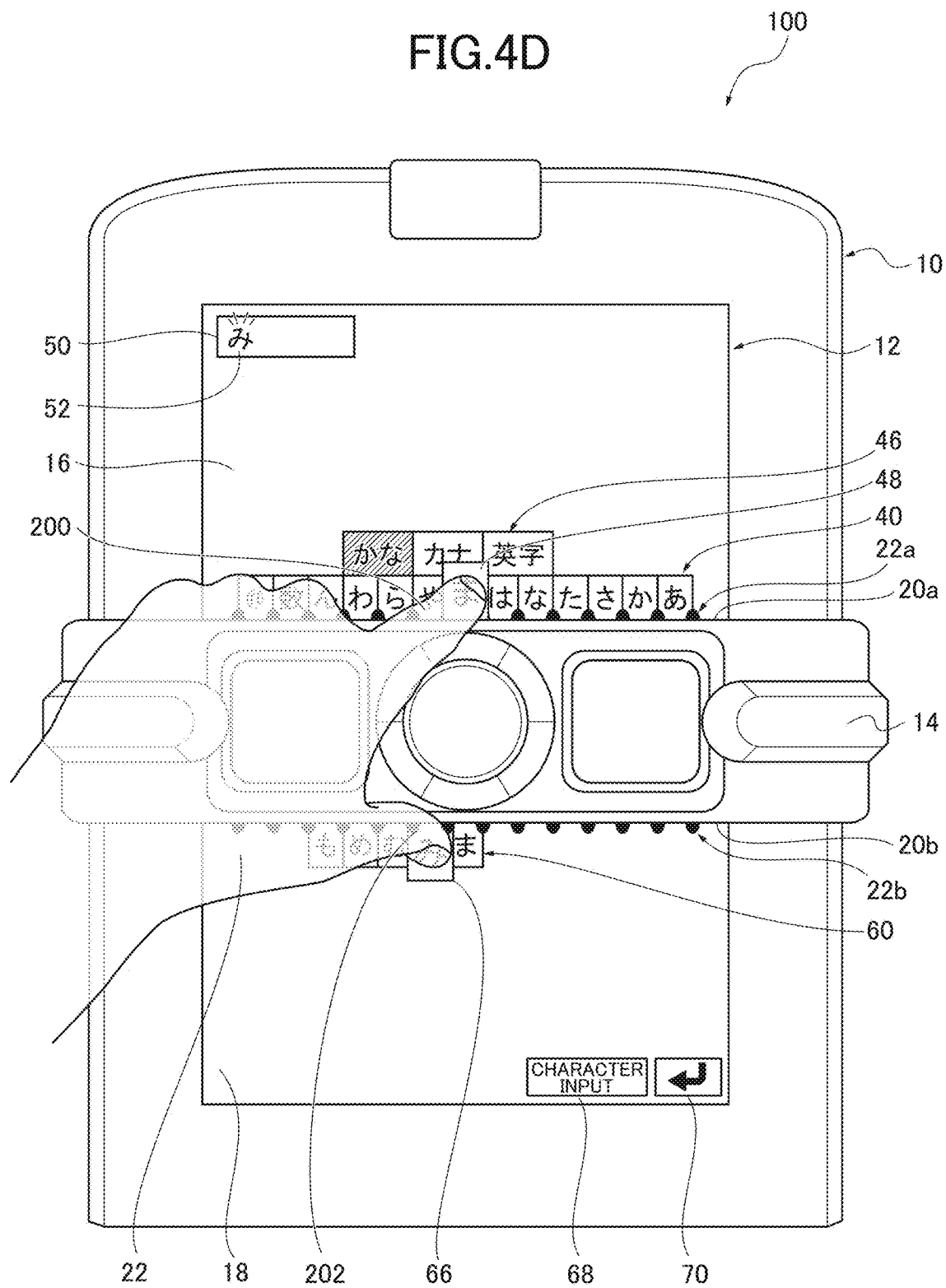
FIG. 4D is a view of an example of an input screen of the character input assist device in a node N4 state in FIG. 3.

A node N4 state in the state transition diagram in FIG. 3 will be described with reference to FIG. 4D. In the node N4 state, the panel surface of the character input assist device 100 is in a state as shown in FIG. 4D. At the time, the operator of the character input assist device 100 touches the side edge part 20b of the partition member 14 while pressing a selected first character icon 48 with the finger 200 (such as the index finger), slides the finger 202 (such as the thumb) in the widthwise direction while pressing the second character icon 60, and moves the finger 202 to the position of the desired second character icon 60. At the time, the finger 202 is in contact with the raised parts of the icon identifiers 22b, and therefore the operator can recognize the position of the desired second character icon 60 without paying continuous attention to the panel surface 12 by recognizing how many times the operator has touched the raised part of the icon identifier 22b.

As described above, the second character icon 60 is displayed in the vicinity of the position opposed to the selected first character icon 48 across the partition member 14, and therefore the position of the desired second character icon 60 can be easily pressed with the finger 202 while pressing the selected first character icon 48 with the finger 200.

At the time, the character input controller 86 (FIG. 2) carries out the character icon selection control, and the pressed second character icon 60 is selected. The character icon display controller 84 (FIG. 2) carries out the character icon enlarged display control, and the pressed second character icon 60 is enlarged and displayed as the selected second character icon 66. Every time the selected second character icon 60 is changed, the character icon display controller 84 (FIG. 2) carries out the character icon enlarged display end control and the enlarged display of the selected second character icon 66 ends.

Also at the time, the display of a character corresponding to the selected second character icon 66 flashes on and off in the input character window 50 as the selected character 52. When there is a transition from the node N3 or the node N5 shown in FIG. 3 to the node N4, a character input result determined at the time is also displayed in the input character window 50.

Description of Node N5 State

Now, the node N5 state in the state transition diagram in FIG. 3 will be described with reference to FIG. 4E. In the node N5 state, the panel surface of the character input assist device 100 is in a state as shown in FIG. 4E. In the state, the operator of the character input assist device 100 releases the finger 202 from the selected second character icon 66 shown in FIG. 4D. Then, the character input controller 86 (FIG. 2) carries out the character icon determination control and input of the selected second character icon 66 is determined. At the time, the character icon display controller 84 (FIG. 2) carries out the character icon enlarged display end control, so that the enlarged display of the selected second character icon 66 (FIG. 4D) ends.

Then, in the input character window 50, the input determined character 56 is displayed, and the display of a character corresponding to the selected first character icon 48 pressed with the finger 200 flashes on and off as the selected character 52.

Description of State Transition from Node N1

In the node N1 state, when the character input switch 68 (FIG. 4A) is pressed, a transition to the node N2 state via an arc A1 is caused.

Description of State Transition from Node N2

In the node N2 state, when the character input completion switch 70 (FIG. 4B) is pressed, a transition to the node N1 via the arc A2 is caused.

Also in the node N2 state, when the first character icon 40 (FIG. 4B) is pressed and selected, a transition to the node N3 state via an arc A3 is caused.

Description of State Transition from Node N3

In the node N3 state, when the finger 200 (FIG. 4C) is released from the selected first character icon 40 (selected first character icon 48) (FIG. 4C), a transition to the node N2 state via an arc A4 is caused.

Also in the node N3 state, when the finger 200 (FIG. 4C) is moved and a different first character icon 40 (FIG. 4C) is selected, the node N3 state is repeated via an arc A5.

Then in the node N3 state, when a second character icon 60 (FIG. 4C) is pressed and selected, a transition to the node N4 state via an arc A6 is caused.

Description of State Transition from Node N4

In the node N4 state, when the finger 202 (FIG. 4D) is moved and a different second character icon 60 (FIG. 4D) is selected, the node N4 state is repeated via an arc A7.

In the node N4 state, when the finger 202 (FIG. 4D) is released from the selected second character icon 60 (selected second character icon 66) (FIG. 4D), a transition to the node N5 state via an arc A8 is caused.

In the node N4 state, when the finger 200 (FIG. 4D) is released from the selected first character icon 40 (selected first character icon 48) (FIG. 4D), a transition to the node N2 state via an arc A9 is caused.

Description of State Transition from Node N5

In the node N5 state, when the finger 200 (FIG. 4E) is moved and a different first character icon 40 (FIG. 4E) is selected, a transition to the node N3 state via an arc A10 is caused.

In the node N5 state, when a second character icon 60 is pressed and selected, a transition to the node N4 state via an arc A11 is caused.

In the node N5 state, when the character input completion switch 70 (FIG. 4E) is pressed, a transition to the node N1 state via an arc A12 is caused.

Also in the node N5 state, when the finger 200 (FIG. 4E) is released from a selected first character icon 40 (selected first character icon 48) (FIG. 4E) a transition to the node N2 state via an arc A13 is caused.

Description of Operation when Inputting Alphabet

Figure 5A:
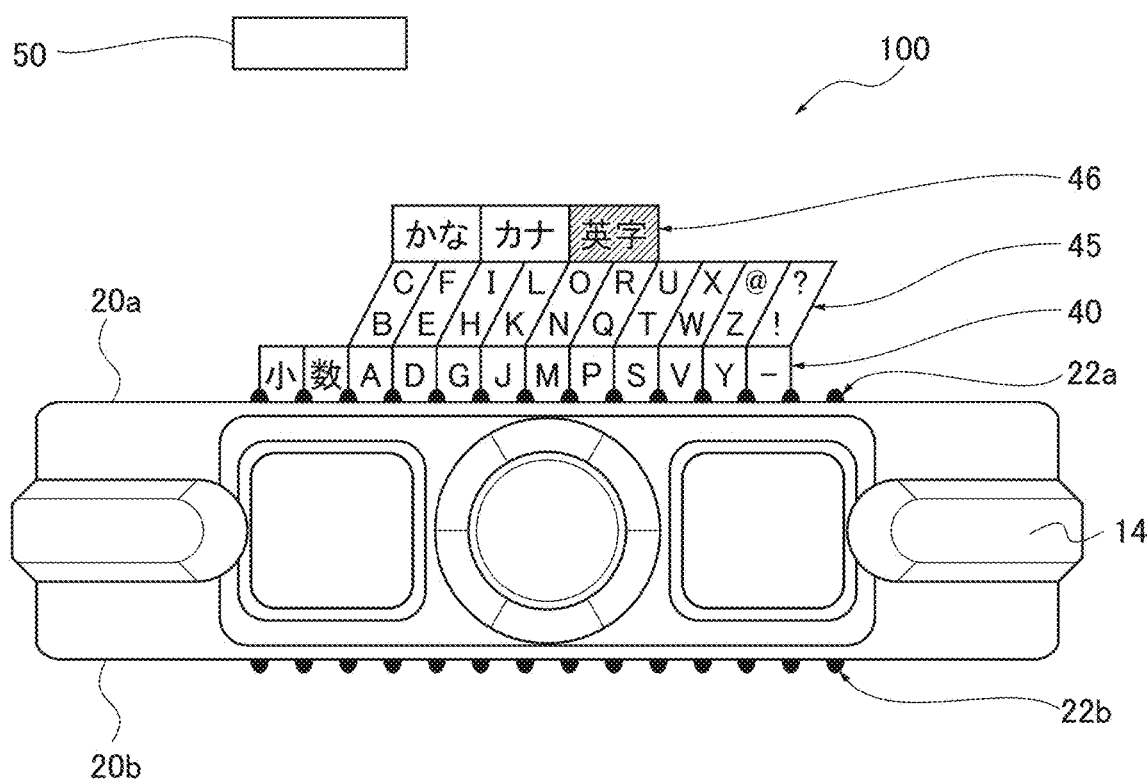
FIG. 5A is a first view of an example of a character input screen when alphabet letters are input according to First Embodiment.
Figure 5B:
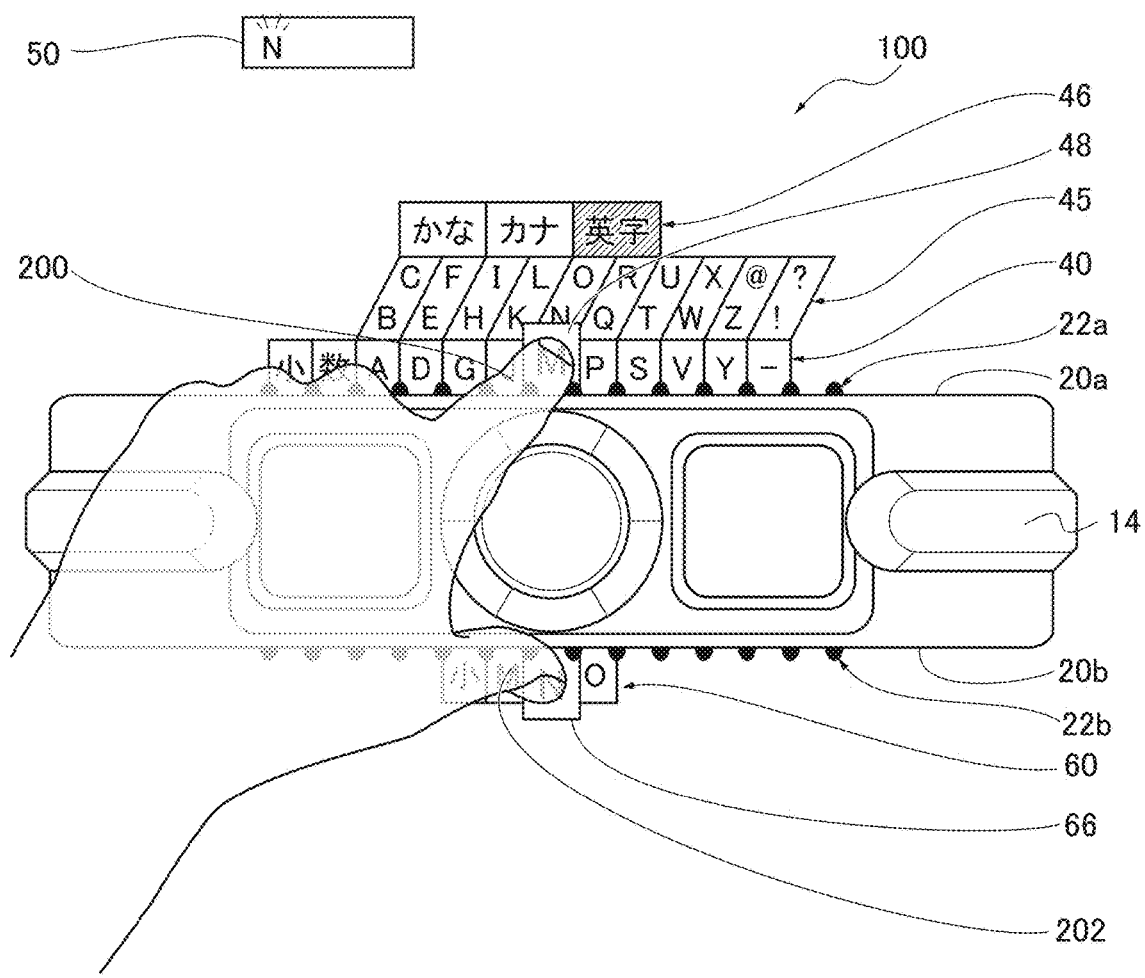
FIG. 5B is a second view of the example of the character input screen when alphabet letters are input according to First Embodiment.

With reference to FIGS. 5A and 5B, a method of inputting alphabet letters by the character input assist device 100 will be described.

FIG. 5A shows the state of the screen when the character input assist device 100 is in the node N2 state in FIG. 3 and the "英字" (English alphabet) of the character-kind icons 46 is pressed. In the case, first character icons 40 representing the alphabet letters and related supplementary symbols are displayed above the partition member 14. Note that the alphabet letters are grouped by consecutive three letters, and the two alphabet letters following a letter displayed as the first character icon 40 are displayed above the first character icon 40 to be inclined rightward as first character supplementary icons 45.

As shown in FIG. 5B, the operator of the character input assist device 100 selects a desired alphabet letter from the first character icons 40 and the first character supplementary icons 45. To this end, the operator slides the finger 200 along the side edge part 20a of the partition member 14 while pressing the first character icons 40, and presses the position of the group to which the desired alphabet letter belongs. For example, when the alphabet letter "N" is desired to be input, "M" in the group to which "N" belongs is selected as shown in FIG. 5B. The selected alphabet letter "M" is enlarged and displayed as the selected first character icon 48.

Here, when the alphabet letter "M" is selected, the alphabet letters of the group to which the letter "M" belongs are displayed as the second character icons 60 under the partition member 14. As shown in FIG. 5B, the operator of the character input assist device 100 then presses the second character icon 60 with the finger 202, slides the finger 202 along the side edge part 20b of the partition member 14, and selects the desired alphabet letter "N." The selected alphabet letter "N" is enlarged and displayed as the selected second character icon 66 and also flashes on and off in the input character window 50.

Then, when the finger 202 is released from the selected second character icon 66, selection of the alphabet letter "N" is determined and input of the letter is complete.

Note that in FIG. 5A, the first character supplementary icons 45 are displayed to be inclined rightward so that the first character supplementary icon 45 and the second character icon 60 can be easily associated when the second character icon 60 is displayed as shown in FIG. 5B. It is needless to mention that each of the first character supplementary icons 45 displayed above the partition member 14 (above the first character icons 40) may be directly selected for input. In this case, the second character icons 60 may or may not be displayed under the partition member 14. When the second character icons 60 are not displayed, input using only the upper part of the partition member 14 (only one side edge part 20a) can be carried out.

Description of Numerical Input Operation

Now, with reference to FIG. 6, a method of inputting numbers by the character input assist device 100 will be described.

Figure 6:
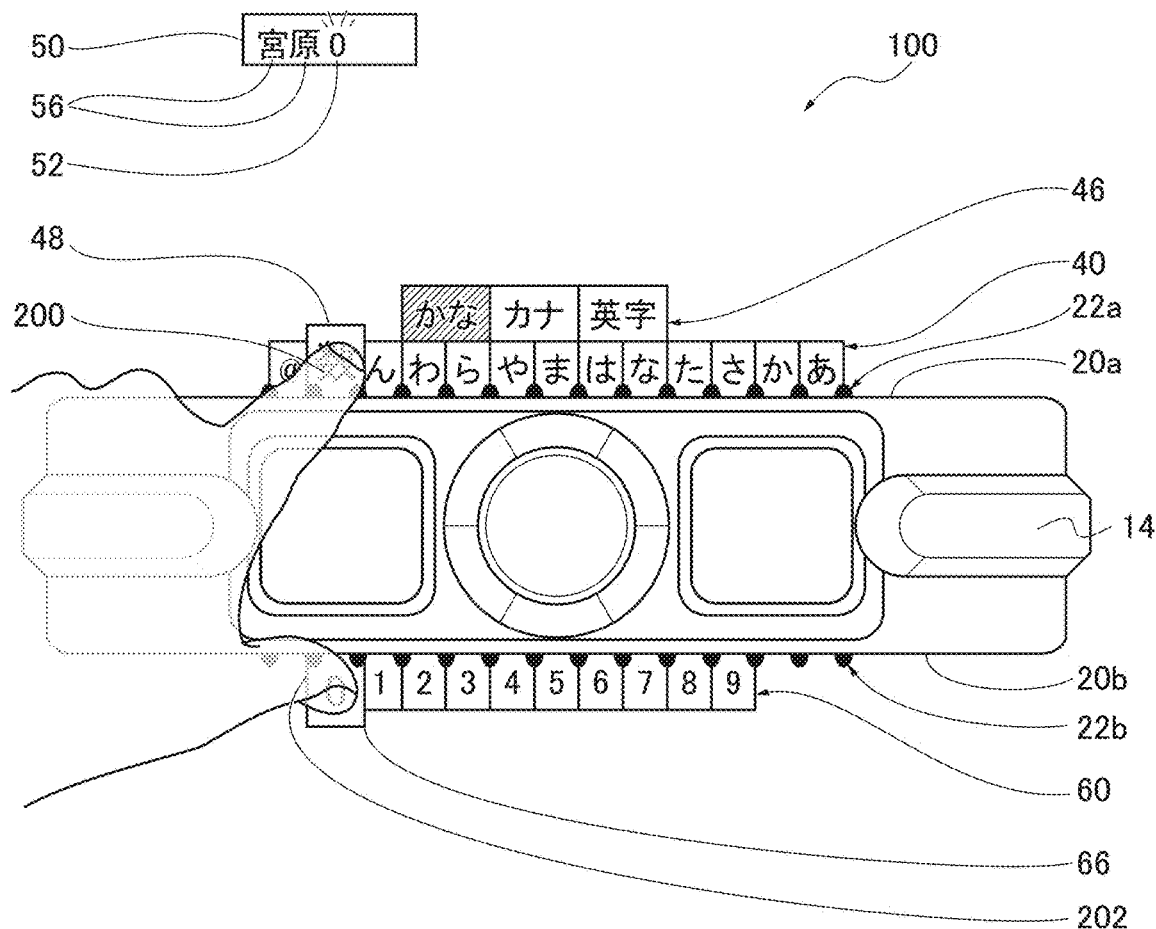
FIG. 6 is a view of an example of a character input screen used when a number is input according to First Embodiment.

FIG. 6 shows the state of the screen when the character input assist device 100 is in the node N2 state in FIG. 3 and "数" among the first character icons 40 is pressed. At the time, the numbers from 0 to 9 are displayed as the second character icons 60 under the partition member 14.

Then, the operator of the character input assist device 100 slides the finger 202 along the side edge part 20b of the partition member 14 and presses a desired number such as "0" while pressing the second character icon 60. Then, "0" for the pressed second character icons 60 is selected and enlarged and displayed as the selected second character icon 66. In the input character window 50, the display of "0" flashes on and off as the selected character 52 following the determined character 56 determined at the time. Then, when the finger 202 is released from the selected second character icon 66, the selection of the number "0" is determined.

Description of Modification of First Embodiment

In the above description of First Embodiment, the icon identifiers 22a and 22b are identical raised parts that project from the side edge parts 20a and 20b of the partition member 14, but the shape of the icon identifiers 22a and 22b is not limited to the above. More specifically, as shown in FIGS. 7A and 7B, any of the other shapes may be employed.

Figure 7A:
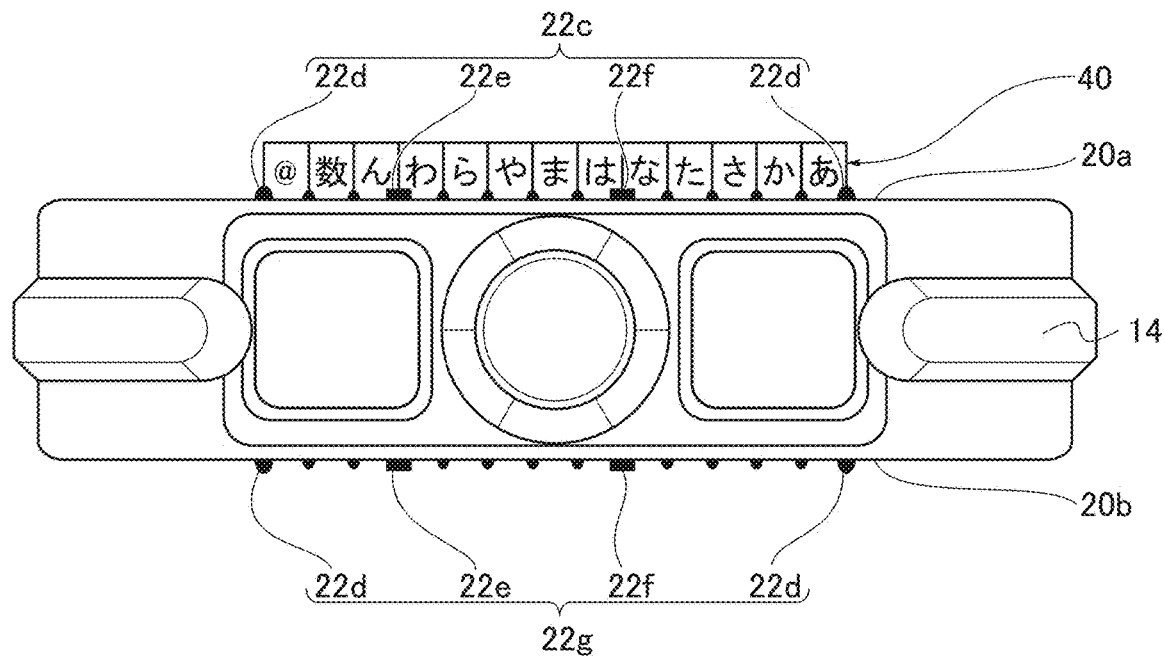
FIG. 7A is a first view of an example of a different form of an icon identifier according to First Embodiment.
Figure 7B:
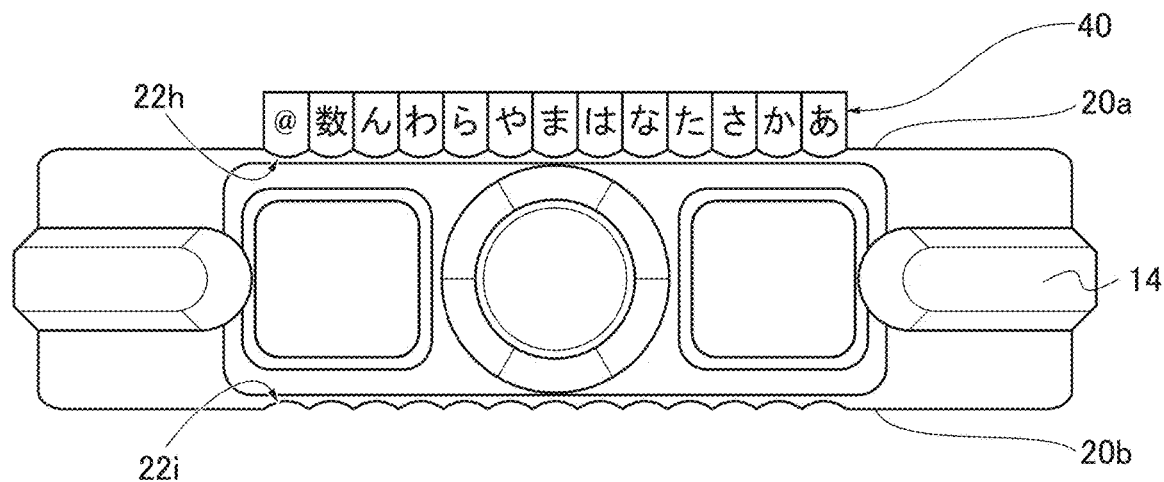
FIG. 7B is a second view of the example of the different form of the icon identifier according to First Embodiment.

FIG. 7A shows a modification in which raised parts provided as icon identifiers 22c and 22g at the side edge parts 20a and 20b have different shapes among locations. More specifically, icon identifiers 22d having a greater size than the other raised parts are provided at the left and right ends of the icon identifiers 22c and 22g, so that the presence of the left and right ends may be emphasized.

Icon identifiers 22e in a different shape from the other raised parts are provided at prescribed intervals and used as a guide for selecting the desired first character icon 40 (second character icon 60 (FIG. 2)).

The icon identifiers 22c and 22g are formed, so that a desired character icon can be selected without paying continuous attention to the panel surface during operation.

FIG. 7B shows an example of icon identifiers 22h and 22i in the form of notches recessed at the side edge parts 20a and 20b. The presence of the icon identifiers in the form allows the individual first character icons 40 to be surely identified without paying continuous attention to the panel screen during operation.

Specific examples of the form of icon identifiers may include any of other shapes such as a groove or line distinguishable by tactile sensation to the finger in addition to the above-described raised parts or notches.

Note that according to First Embodiment, the partition member 14 is provided to divide the panel surface 12 of the touch panel into upper and lower parts, while the partition member 14 may be provided to divide the panel surface 12 of the touch panel into left and right parts, and still the same character input assist device can be provided. In the case, the first character icons 40 may be arranged in the longitudinal direction in a region on the left side of the partition member 14 and the second character icons 60 may be arranged in the longitudinal direction in a region on the right side of the partition member 14.

According to First Embodiment, the selection of the second character icon 60 displayed in the second region 18 is determined and character input is carried out, while when a character in the " あ " row is input in particular, the first character icon 40 displayed in the first region 16 may be selected in the state in FIG. 4C, and then selection of hiragana " ま " may be determined by releasing the finger 200.

Also although First Embodiment does not describe the conversion of the hiragana in Japanese into a Chinese character after the implementation of "hiragana input", after the "hiragana input" is implemented, the hiragana may be converted into a Chinese character, for example, by turning the dial 24 shown in FIG. 1.

Second Embodiment

Figure 8:
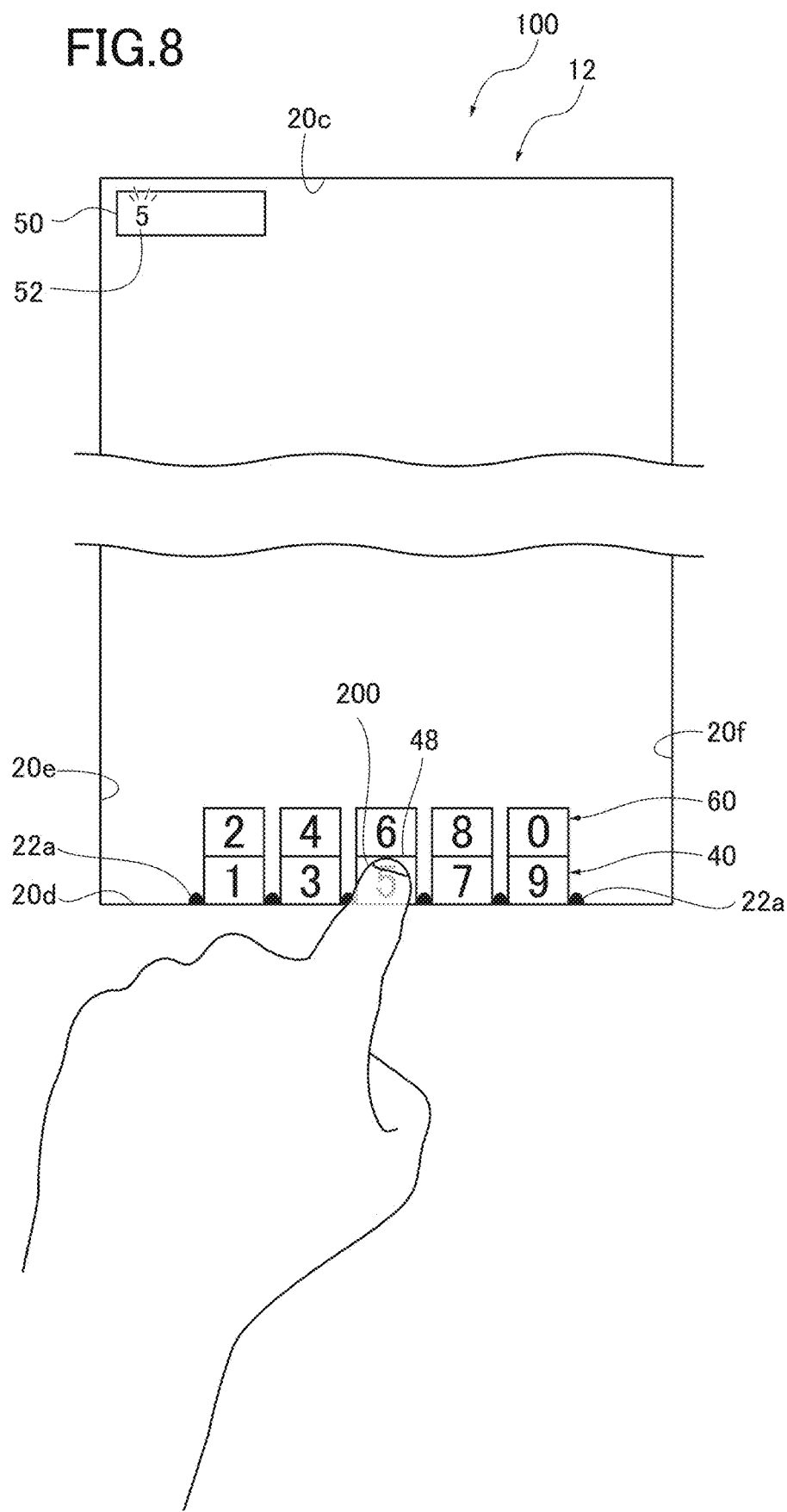
FIG. 8 is a partly enlarged view of a character input assist device according to Second Embodiment.
Figure 9A:
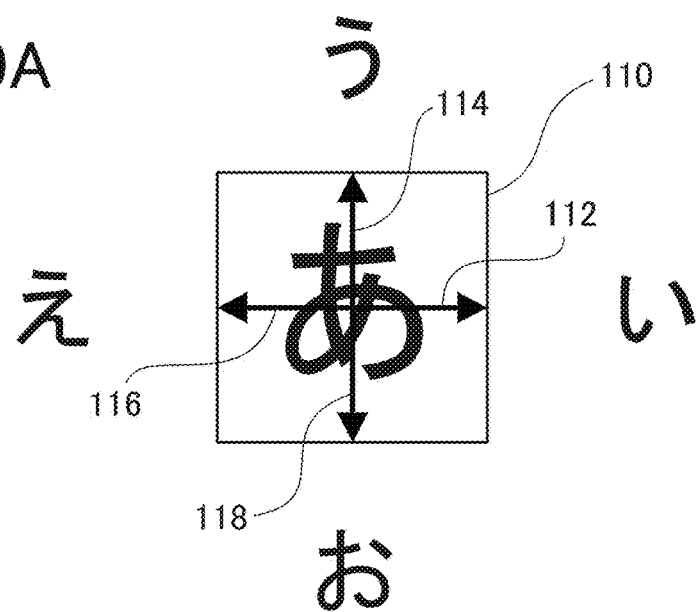
FIG. 9A is a view of an example of a character input switch in an existing character input assist device.
Figure 9B:
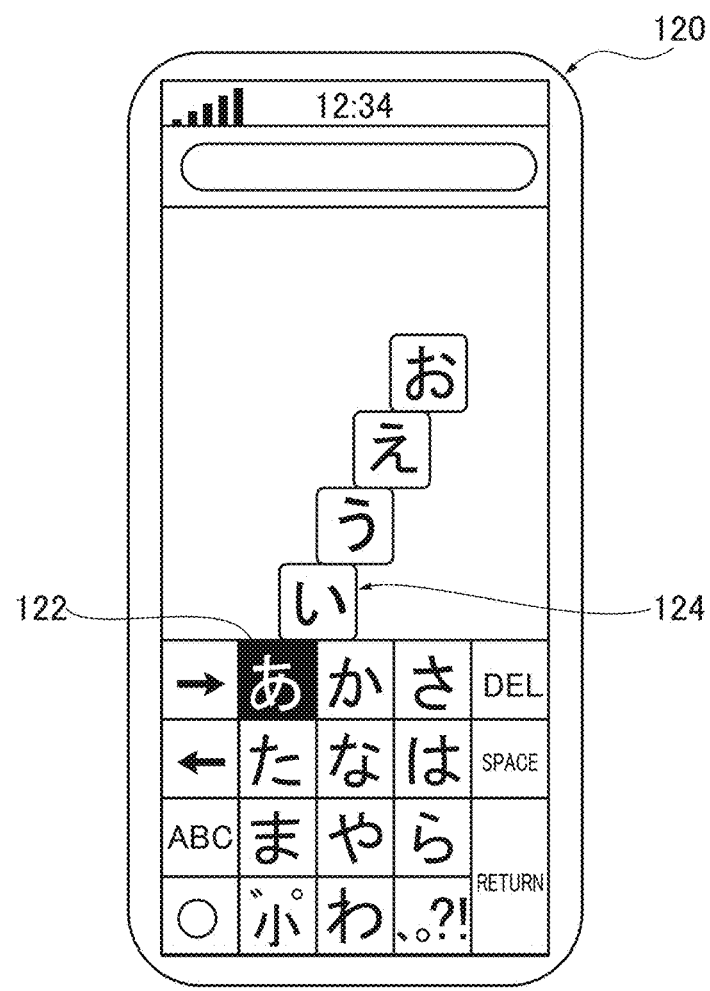
FIG. 9B is a view of another example of a character input switch in an existing character input assist device.

FIG. 8 shows Second Embodiment. According to Second Embodiment, edge parts (all or any of the upper edge part, the lower edge part, the right edge part, and the left edge part) of the panel surface 12 of the touch panel in the main body 10 of a character input device (or input display device) such as a multi-function mobile terminal may be used as the side edge parts 20c to 20f. In this example, the icon identifiers 22a are provided along the lower edge as the side edge part 20d, a plurality of first character icons 40 are displayed sequentially one by one above the side edge part 20d, and second character icons 60 are displayed above the plurality of first character icons 40.

More specifically, when numbers are input, the numbers are grouped by two, and odd numbers are set as the first character icons 40 and even numbers and "0" are set as the second character icons 60.

In this way, the second character icons 60 are displayed above the plurality of first character icons 40, so that numbers may be input using only the side edge part 20d. Note that also according to this embodiment, the partition member 14 may be provided at the panel surface 12 of the touch panel.

As in the foregoing, the character input assist device 100 according to the embodiment can provide the following advantageous functions and effects.

(1) The device includes one or more side edge parts 20a to 20f provided to have a step serving as a finger hold with respect to a panel surface 12 of a touch panel, a character icon display controller 84 that displays a plurality of first character icons 40 along the side edge parts 20a to 20f on the panel surface 12 and one or more second character icons 60 associated with a selected first character icon 48 selected from the plurality of first character icons 40 on the panel surface 12, a character input controller 86 that carries out input of a character corresponding to the selected first character icon 48 selected from the first character icons 40 or input of a character corresponding to a selected second character icon 66 selected from the second character icons 60, and icon identifiers 22a to 22i provided at the side edge parts 20a to 20f to allow the first character icons 40 or the second character icons 60 to be individually identified.

The character icon display controller 84 displays the plurality of first character icons 40 in the first region 16 and the plurality of second character icons 60 in the second region 18 along at least one of the side edge parts 20a to 20f provided to have a step serving as a finger hold with respect to the panel surface 12 of the touch panel, and the character input controller 86 carries out input of a character corresponding to a selected first character icon 40 or input of a character corresponding to a selected second character icons 60, so that the first character icons 40 and the second character icons 60 can be readily selected by sliding the finger along the side edge parts 20a to 20f. More specifically, first and second character icons 40 and 60 desired to be input can be surely selected without paying continuous attention to the character icons, so that character icon input operation can be surely carried out in a simplified manner and in a short time.

In the character input assist device 100 according to First Embodiment, the side edge parts 20a to 20f are provided with the icon identifiers 22a to 22i used to individually identify the first character icons 40 and the second character icons 60, and therefore how much the finger should be slid to select a desired character icon can be grasped beforehand in selecting a first character icon 40 and a second character icon 60. Therefore, the frequency of visual observation for ascertaining selected icons may be lowered, so that time required for selecting and inputting character icons may be even more reduced.

(2) The icon identifiers 22a to 22i are raised parts (22a to 22g) or recessed parts (22h, 22i) that individually separate the first character icons 40 or the second character icons 60 (at the side edge parts 20a to 20f). Therefore, the first character icons 40 or the second character icons 60 can be readily identified by tactile sensation to the finger.

(3) The first character icon 40 represents information about a representative character for each group obtained by segmenting characters into groups, and the second character icon 60 represents information associated with a selected first character icon 48 among information about characters that belong to the same group as that each of the first character icons 40 belongs to. Therefore, Japanese "hiragana" information for example can be efficiently input.

(4) The first character icon 40 represents information about a character that heads a group obtained by segmenting alphabet letters into groups sequentially by a prescribed number of letters, and the second character icon 60 represents information associated with the selected first character icon 48 among information about letters that belong to the same group as that the alphabet letter set as the first character icon 40 belongs to. Therefore, alphabet information can be efficiently selected and input.

(5) The first character icon 40 is a character-kind icon that represents a character kind, and the second character icon 60 represents information about a character that belongs to a character kind selected from the first character icons 40. Therefore, character information including different character kinds can be switched in a simplified manner and efficiently input.

(6) The character input controller 86 detects deselection of the selected first character icon 48 or deselection of the selected second character icon 66 and carries out input of a character corresponding to the deselected, selected first character icon 48 or selected second character icon 66. Therefore, determination operation for character input can be carried out in a simplified manner.

(7) A partition member 14 is provided on the panel surface 12 of the touch panel to divide the panel surface 12 into a first region 16 and a second region 18, edge parts on both sides of the partition member 14 serve as a pair of the side edge parts 20a and 20b, and the character icon display controller 84 is configured to display the first character icons 40 along one side edge part 20a and the second character icons 60 along the other side edge part 20b. Therefore, the first character icons 40 and the second character icons 60 can be selected readily by sliding the finger along the side edge parts 20a and 20b provided at the edge parts on the sides of the partition member 14.

(8) The character icon display controller 84 is configured to display the second character icon 60 in a vicinity of a position opposed to the selected first character icon 48 across the partition member 14. Therefore, a quick transition to selection of a second character icon 60 may be caused following selection of a first character icon 40. Therefore, the character inputting speed can be increased.

While the embodiments have been described in detail with reference to the drawings, the embodiments are for illustration purpose only. Therefore, the embodiments should not be construed as limiting, and for example design changes without departing from the gist of the invention naturally fall within the scope of the invention. It should be understood that when for example multiple configurations are included in each of the embodiments, possible combinations thereof are also included in the scope though not specifically described. When multiple embodiments and modifications are disclosed, possible combinations covering both the embodiments and the modifications are naturally included in the scope though not specifically described. The configurations shown in the drawings are naturally included in the scope though not specifically described. Furthermore, the wording such as "etc." implies inclusion of equivalents. The wording such as "substantially," "about," and "around" indicates that a generally permissible range or precision is included in the scope.

REFERENCE SIGNS LIST

12 Panel surface
14 Partition member
16 First region
18 Second region
20a to 20f Side edge part
22a to 22i Icon identifier
40 First character icon
48 Selected first character icon
50 Input character window
52 Selected character
60 Second character icon
66 Selected second character icon
68 Character input switch
70 Character input completion switch
80 Selected position detector
82 Touch panel control ECU
84 Character icon display controller
86 Character input controller
100 Character input assist device

CROSS-REFERENCE TO RELATED APPLICATIONS

This application claims priority to Patent Application No. 2014-245151 and Patent Application No. 2015-184946 filed in Japan Patent Office on Dec. 3, 2014 and Sep. 18, 2015, respectively, and the disclosures of the applications are incorporated herein by reference in their entirety.

The invention claimed is:

1. A character input assist device, comprising:
  a body;
  a touch panel secured to the body and having a panel surface;
  a partition member movably secured to the body and positioned relative to the touch panel to define a first region of the panel surface and a second region of the panel surface, wherein the partition member includes a first side edge part having a plurality of side markers protruding from a surface of the first side edge part, and a second side edge part having a plurality of side markers protruding from a surface of the second side edge part;
  a character icon display controller configured to display a plurality of first character icons on the panel surface along the first side edge part and adjacent to one or more of the side markers protruding from the first side edge part; and
  a character input controller configured to carry out input of a character corresponding to a selected first character icon; wherein upon selection of a first character icon, the character icon display controller is configured to display one or more second character icons associated with the selected first character icon in the second region along the second side edge part.

2. The character input assist device according to claim 1, wherein
  the first character icon represents information about a representative character for each group obtained by segmenting characters into groups, and
  the second character icon represents information associated with the selected first character icon among information about characters that belong to the same group as that each of the first character icons belongs to.

3. The character input assist device according to claim 1, wherein
  the first character icon represents information about a character that heads a group obtained by segmenting alphabet letters into groups sequentially by a prescribed number of letters, and
  the second character icon represents information associated with the selected first character icon among information about characters that belong to the same group as that the alphabet letter set as the first character icon belongs to.

4. The character input assist device according to claim 1, wherein
  the first character icon is a character-kind icon that represents a character kind, and
  the second character icon represents information about a character that belongs to a character kind selected from the first character icons.

5. The character input assist device according to claim 1, wherein the character input controller is configured to detect deselection of the selected first character icon or deselection of the selected second character icon and carry out input of a character corresponding to the deselected, selected first character icon or selected second character icon.

6. The character input assist device according to claim 1, wherein the icon identifier is a raised part or a recessed part that individually separates the first character icon or the second character icon.

7. The character input assist device according to claim 1, wherein selection of the first character icon or the second character icon is by tactile sensation.

8. The character input assist device according to claim 1, wherein each first character icon is aligned with a corresponding side marker protruding from the first side edge part on the panel surface.

9. The character input assist device according to claim 1, wherein the partition member is sized and shaped solely for a one-hand operation.

10. The character input assist device according to claim 1, wherein the partition member is configured to moved lengthwise along the body.

11. The character input assist device according to claim 1, wherein the character input controller is further configured to carry out input of a character corresponding to a selected second character icon.

12. The character input assist device according to claim 1, wherein the second character icon associated with the selected first character icon is displayed in the second region in a position opposite the selected first character icon.

* * * * *